United States Patent [19]

Reeds

[11] Patent Number: 4,772,846

[45] Date of Patent: Sep. 20, 1988

[54] WAFER ALIGNMENT AND POSITIONING APPARATUS FOR CHIP TESTING BY VOLTAGE CONTRAST ELECTRON MICROSCOPY

[75] Inventor: John W. Reeds, Thousand Oaks, Calif.

[73] Assignee: Hughes Aircraft Company, Los Angeles, Calif.

[21] Appl. No.: 947,210

[22] Filed: Dec. 29, 1986

[51] Int. Cl.$^4$ ............................................. G01R 31/02
[52] U.S. Cl. ............................ 324/158 F; 324/158 R
[58] Field of Search ............ 324/158 F, 158 R, 73 PC, 324/73 AT, 73 R

[56] References Cited

U.S. PATENT DOCUMENTS 4,212,075 7/1980 Cleversey et al. .............. 324/73 AT
4,593,820 6/1986 Antonie et al. .................. 324/158 F Primary Examiner—Ernest F. Karlsen
Attorney, Agent, or Firm—Stephen C. Kaufman; V. G. Laslo; A. W. Karambelas

[57] ABSTRACT

An apparatus for use in testing IC chips on a semiconductor wafer is disclosed that allows the wafer and an electrical probe to be independently positioned and then clamped together and moved as a single unit when they are in alignment. This permits a chip on a wafer to be supplied with power and tested electronically while any desired area of the chip can be positioned in the field of view of a scanning electron microscope for examination, such as with a voltage-contrast secondary-electron detector. Use of the disclosed apparatus will greatly facilitate and simplify the testing of unbonded chips on semiconductor wafers.

15 Claims, 3 Drawing Sheets

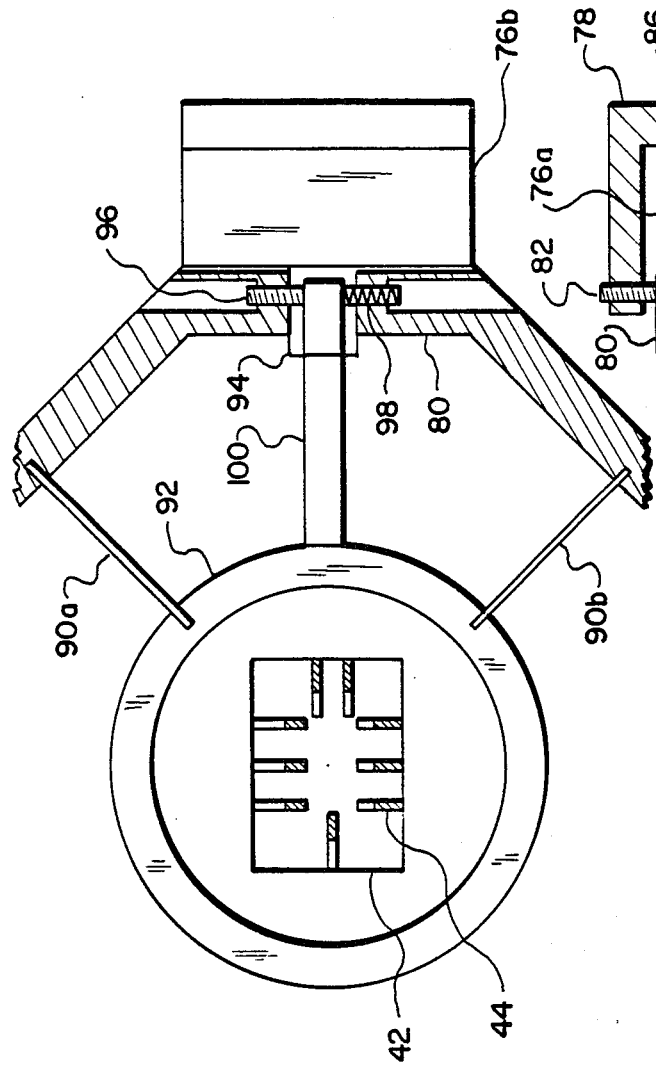
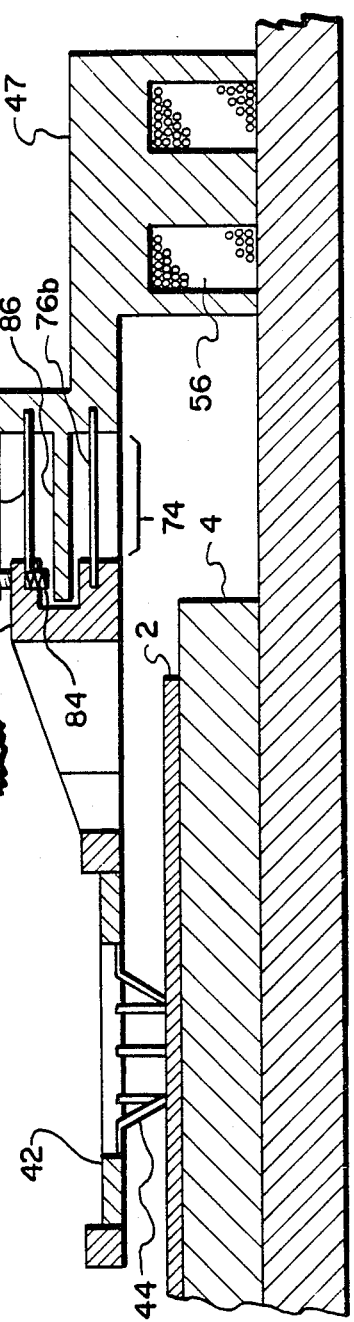
Fig. 2.
Fig. 3.

WAFER ALIGNMENT AND POSITIONING APPARATUS FOR CHIP TESTING BY VOLTAGE CONTRAST ELECTRON MICROSCOPY

BACKGROUND OF THE INVENTION

1. Field of the Invention

The present invention relates to apparatus for alignment and positioning of a semiconductor wafer in the testing of integrated circuit chips on the wafer, and in particular to wafer alignment and positioning apparatus used in testing of a chip by observation with voltage contrast electron microscopy while the chip circuits are powered through electrical probe contacts.

2. Description of Related Art

An integrated circuit (or IC) is a complete electronic circuit containing transistors and perhaps diodes, resistors, and capacitors together with their electrical interconnections, processed on and contained completely within a single chip of silicon. The size of the chip is typically on the order of 1/16th inch square. The advantages of such small size include the possibility of building extremely complicated systems such as powerful digital computers which are very compact. Small circuits not only require less space but less power as well, so that power supplies and cooling equipment can also be correspongingly smaller and less expensive. The cost savings from the use of ICs are not just those derived from their smaller size, however. A large part of their economy stems from the decreased manufacturing cost of the circuits themselves. The cost of processing a semiconductor chip is roughly proportional to its area, whether it holds a single transistor or a complex IC, because roughly the same number of manufacturing steps are involved in producing a wafer. By packing more components into a smaller chip area, the cost per component is reduced. An additional saving lies in the fact that the use of IC building blocks translates into fewer parts to order, inventory, and assemble into a given system.

In addition to all the advantages of small size and low cost, there is also the enormous advantage of much better reliability—the fact that a circuit or system can perform for a long time without degradation of performance or breakdowns. IC systems are much less inclined to fail than discrete versions of the same system. The most important reason for this is that IC systems require significantly fewer solder joints and mechanical connections, and these account for most failures in a solid-state system. Furthermore, because the use of ICs means fewer separately assembled components, there is a smaller chance of mistakes being made in assembly, or of faulty components being used.

The manufacture of IC chips starts with a wafer cut from a single crystal of a semiconductor such as silicon. Numerous chips are fabricated on the wafer at one time, and the wafer is then cut up into its separate chips. In a typical manufacturing process, successive diffusions of dopants are made through appropriately shaped windows etched in the oxide layer by an acid. After each diffusion, the set of windows is covered by growing a new oxide layer, and after a final set of windows is etched, a layer of gold or aluminum metallization is deposited over the oxide. An acid is again used to eat away all but certain desired strips and squares of the metal to leave a pattern of electrical leads and large bonding pad areas at the ends of some leads. Fine gold wires are attached during the assembly process, after a chip has been cut from the wafer. After assembly each individual IC is put through many tests of its electrical performance to ensure that it meets specifications.

It is advantageous to be able to test chips while they are still on the wafer, before the gold wires are attached to the bonding pads, so that defective chips are culled before bonding takes place. Wafers are generally tested on an automatic test system that applies test patterns to the chip through probes. Commercial wafer test probes are manufactured which allow metal probe fingers to connect mechanically to any particular chip on a semiconductor wafer and which allow electrical tests to be made on that chip. The time required to apply a sufficiently large number of test stimuli to determine that the chip under test is functioning correctly can have an important effect on the cost of the final product.

Another way to test a semiconductor chip which provides additional information is to examine the chip while the circuits of the chip are operating with a scanning electron microscope equipped with a voltage contrast detector. The rate of secondary electron emission varies with the voltage at a given area, and this variation is converted into contrast variation in the readout mechanism, such as a television monitor screen. This method of testing allows observation of voltages at any point in the chip, not just at the points which are connected to mechanical probes or bond wires.

Not all of a very large VLSI chip can be seen at one time in a scanning electron microscope. In order to observe different parts of the chip with a secondary electron detector while the circuits of the chip are powered through mechanical probes, it is necessary in the present state of the art to lift the mechanical probes off the wafer, reposition the wafer, realign the probes with the wafer, and lower the probes into contact with the wafer. This process must be repeated each time a different portion of the chip is looked at. Such a time-consuming procedure makes it impractical to test IC chips routinely in this way.

SUMMARY OF THE INVENTION

It an object of the present invention to provide an apparatus that simplifies testing of unbonded chips on semiconductor wafers by voltage-contrast electron microscopy while the chip circuits are powered through a mechanical test probe.

It is a further object to provide an apparatus that allows easy alignment of the wafer with the test probe fingers and connection of the wafer with the fingers.

It is another object to provide an apparatus which allows the wafer and the test probe to be moved simultaneously as a unit after the test probe fingers are connected to the wafer.

It is yet another object to provide a positioning apparatus that allows alignment of a wafer with a test probe system for fast and convenient testing of the IC chips on that wafer.

Still another object of the invention is to provide a positioning apparatus that facilitates the alignment of a semiconductor wafer with a test probe, and then allows the wafer and probe to be easily clamped together without disturbing the alignment.

It is another object of the invention to provide an apparatus for use in IC chip testing that is adapted for voltage-contrast secondary electron emission microscopy, in which different parts of the chip can be moved around in the field of view of the scanning electron microscope while the circuits of the chip are powered through the mechanical contacts of the probe.

Finally, it is an object of the present invention to provide an apparatus which allows the observation of portions of an integrated circuit which may not be accessible through external electrical connections, and is therefore particularly useful in circuit development work.

The present invention allows a semiconductor wafer and an electrical probe to be independently positioned and then clamped together when they are in alignment. Once the wafer and electrical probe are clamped together, they may then be moved as a unit. This allows a specific chip on a wafer to be activated with electronic test signals, while any desired area on the chip may be positioned under an electron beam for examination, such as by a voltage-contrast secondary electron detector. Voltage-contrast electron microscopy can be quickly performed to test wafer chips while their circuits are operating under power, by moving a chip around in the scanning electron microscope field of view while the mechanical probe contacts are in place.

The wafer to be tested is mounted on a horizontal X-Y stage. The electrical probe is separately mounted on a horizontal X'-Y' stage which is parallel to the first stage and which also includes a provision for vertical motion in the Z direction. Initially the probe stage is raised up above the wafer stage so that contacts on the electrical probe do not touch the wafer. The electrical probe is positioned so that at least some of its contacts are visible in the scanning electron microscope. The wafer is then moved by means of the X-Y stage until the electrical probe contacts are aligned with the appropriate contact pads on the wafer chip to be tested. A Z-axis control then lowers the X'-Y' stage until an electromagnetic clamp contacts the X-Y stage top plate, and the electrical probe contacts connect to the wafer chip contact pads. The electromagnetic clamp is then activated, and the Z drive is disabled. Motion of the X-Y stage will then move the wafer and the electrical probe as a single unit, allowing any desired portion of the chip being tested to be placed within the scan field of the scanning electron microscope.

An appreciation of other aims and objects of the present invention and a more complete understanding of this invention may be achieved by studying the description of the preferred embodiments and by referring to the accompanying drawings.

BRIEF DESCRIPTION OF THE DRAWINGS

FIG. 2 is a partially sectioned plan view of an electrical probe employed in the apparatus and the means of adjusting its angular orientation and its vertical, Z position is a preferred embodiment.

FIG. 3 is a sectional view of the electrical probe and the means of adjusting its angular orientation and its vertical, Z position. Parts of a wafer positioning stage and an electromagnetic clamp are also shown.

DESCRIPTION OF THE PREFERRED EMBODIMENTS

In a preferred embodiment the invention includes a positioning stage for a semiconductor wafer, a second positioning stage for an electrical test probe with mechanical contact "fingers", and an electromagnetic clamping arrangement for connecting the two positioning stages, all forming part of a voltage-contrast scanning electron microscope vacuum chamber system. The wafer positioning stage is capable of being driven by X and Y drives to move the wafer in a horizontal X-Y plane. The probe positioning stage is passively coupled to the wall of the vacuum chamber through translation bearings so as to be able to move horizontally in an X'-Y' plane parallel to the X-Y plane, and can be moved vertically in a Z direction through a mechanical feedthrough arrangement leading outside the vacuum system.

The probe fingers are positioned above and aligned with the contact pads of an IC chip on a semiconductor wafer mounted on the wafer positioning stage. The vertical position of the probe is then adjusted so that the fingers of the probe are touching the contact pads on the IC chip. Electrical power and test signals can then be applied to the test chip, and electrical test readings can be made through the probe finger contacts. The clamping arrangement can be used to connect the two positioning stages so that the wafer and probe move together as a unit while the IC circuits are energized through the probe contact fingers.

A portion of the IC chip in the field of view of the voltage-contrast electron microscope can be viewed while the chip circuits are powered, so that the operation of the chip can be tested. The chip, together with the probe fingers which contact it, can be moved around in the field of view of the microscope to examine any desired area of the chip. The remaining chips on the wafer can be tested in the same manner by deactivating the electromagnetic clamp to separate the two positioning stages, repositioning and realigning the wafer and the probe, lowering the probe fingers to touch the contact pads of another IC chip, and again activating the electromagnet of the clamping arrangement.

Figure 1:
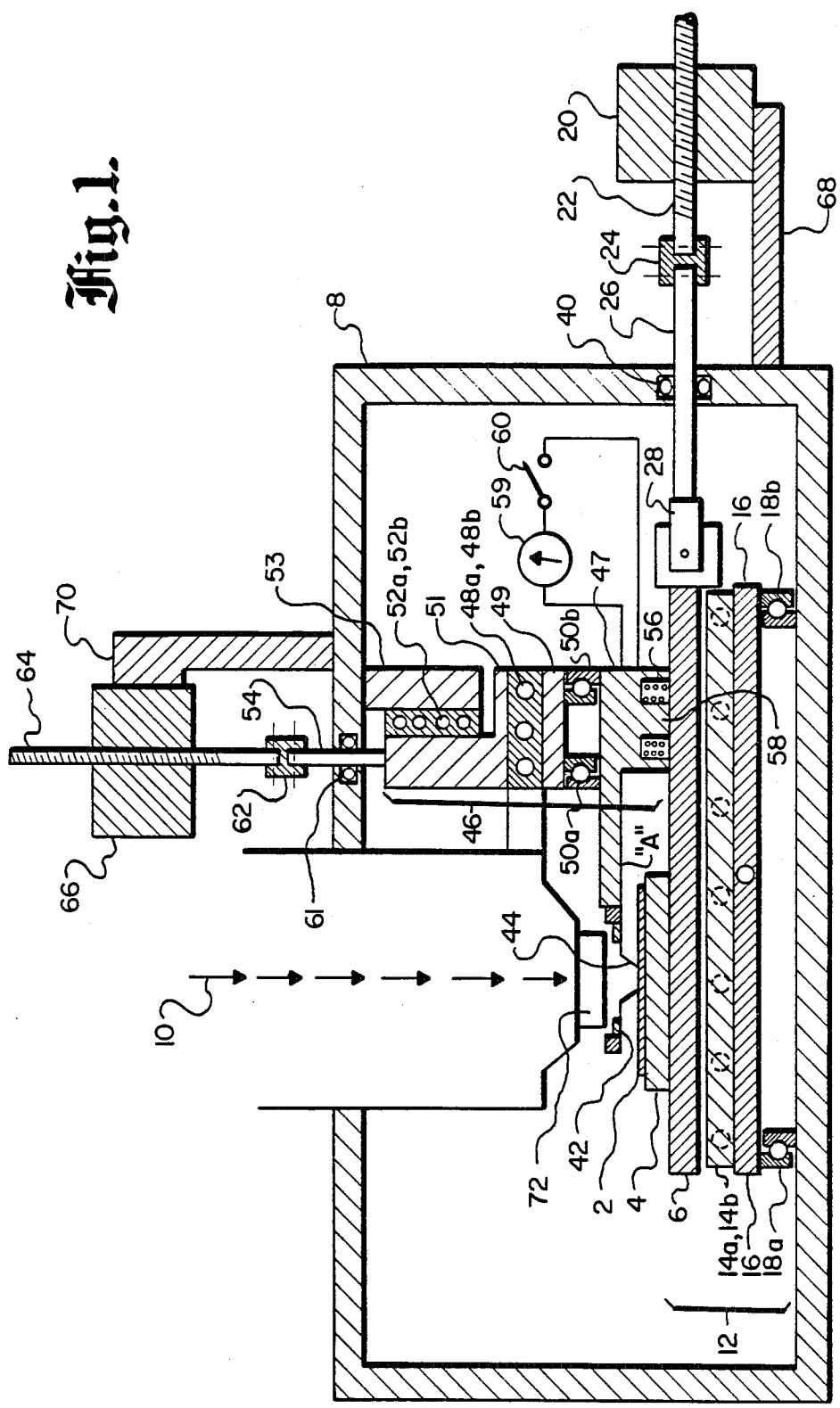
FIG. 1 is a sectional view of the apparatus of the present invention being used in the examination of a semiconductor wafer with a scanning electron microscope.

Referring to FIG. 1, a sectional view of a preferred embodiment of the present invention can be seen. A semiconductor wafer 2 is mounted on a wafer mounting block 4 which is carried on an X-Y stage top plate 6 inside a vacuum chamber 8. The wafer 2 is mounted on the mounting block 4 using a conventional device such as spring clips (not shown) to hold the wafer in place. An electron beam 10 from a scanning electron microscope is directed onto the wafer.

A wafer positioning stage 12 comprises top plate 6, a pair of linear X translation bearings 14a, 14b, an intermediate plate 16, and a pair of linear Y translation bearings 18a, 18b. The top plate 6 is attached to and rides on X translation bearings 14a, 14b, which are mounted on intermediate plate 16. Intermediate plate 16 in turn is attached to and rides on Y translation bearings 18a, 18b. The X translation bearings 14a, 14b permit the top plate 6 to move laterally (in the X direction) in a horizontal (X-Y) plane. Y translation bearings 18a, 18b allow the assembly consisting of top plate 6, X translation bearings 14a, 14b, and intermediate plate 16 to move into or out of the page (the Y direction).

The linear X translation bearings 14a, 14b are arranged so that the top plate 6 moves along an axis parallel to the lines of the bearings 14a, 14b, which are substantially parallel to each other and to the top plate 6 on which the wafer 2 is mounted. The top plate 6 is substantially normal to the electron beam 10. Similarly, the linear Y translation bearings 18a, 18b are arranged so that the intermediate plate 16 moves along an axis parallel to the lines of the bearings 18a, 18b, which are substantially parallel to each other and to the intermediate plate 16.

Figure 4:
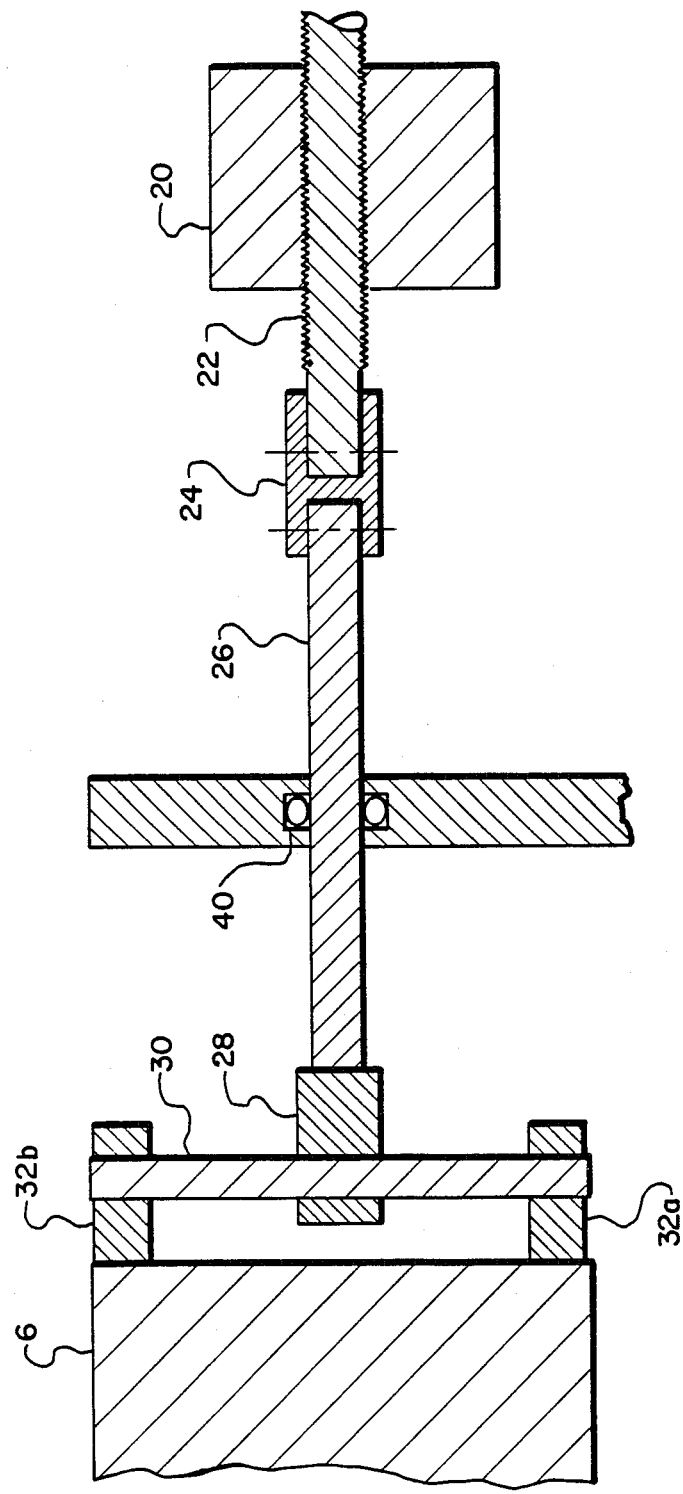
FIG. 4 is a fragmentary sectional view showing details of an X drive linear actuator employed in the alignment and positioning apparatus.

The top plate 6 moves left or right in FIG. 1 in response to an X drive motor 20. The motor has an internal rotor which drives a threaded shaft 22 in lead screw fashion. The shaft 22 in turn pushes or pulls via a coupling 24 on a smooth shaft 26. The end of shaft 26 is held in a bearing block 28. As shown in FIG. 4, the bearing block 28 rides on a rod 30 which is held in brackets 32a, 32b attached to the top plate 6. A Y drive motor (not shown) identical to motor 20 has its threaded shaft attached via a coupling and shaft identical to 24 and 26, respectively, to point 31 directly to intermediate plate 16 to drive the stage in a direction into or out of the plane of FIG. 1. This motion of intermediate plate 16 parallel to the Y translation bearings 18a, 18b makes the bearing block arrangement necessary to allow the point of attachment of the X drive mechanism to move relative to the top plate 6. The smooth shaft 26 enters the vacuum chamber 8 through an "O"-ring seal 40 set in the wall of the chamber, and the shaft which is part of the Y drive system enters the vacuum chamber 8 similarly through another "O"-ring (not shown).

A test probe 42 with a set of metal contact fingers 44 is attached to a probe positioning stage 46. The stage 46 comprises a probe mount 47, a pair of spaced linear X' translation bearings 48a, 48b, a middle plate 49, a pair of spaced linear Y' translation bearings 50a, 50b, an "L"-shaped plate 51, a pair of spaced linear Z translation bearings 52a, 52b, and a vertical mounting plate 53. Probe mount 47 rides on Y' translation bearings 50a, 50b, which are mounted on middle plate 49. Middle plate 49 rides on X' translation bearings 48a, 48b, which are mounted on a horizontal arm of "L"-shaped plate 51. A vertical arm of "L"-shaped plate 51 rides on Z translation bearings 52a, 52b, which are mounted on vertical mounting plate 53. Vertical plate 53 extends downward from the top of the vacuum chamber 8.

The probe mount 47 is able to move in an X'-Y' plane parallel to the X-Y stage top plate on the Y' translation bearings 50a, 50b which in turn are supported by middle plate 49 and X' translation bearings 48a, 48b. Linear bearings 50a, 50b are aligned parallel with each other and are both substantially parallel to the Y direction of the X-Y stage. The middle plate 49 is constrained to move in a direction parallel to the X direction of the X-Y stage, because the two X' translation bearings 48a, 48b are aligned parallel to each other and to the X direction of the X-Y stage. "L"-shaped plate 51 is able to move vertically on Z translation bearings 52a, 52b. The vertical adjustment rod 54 couples the "L"-shaped plate 51 to a vertical drive mechanism.

An electromagnetic clamp is formed on the probe positioning stage 46, as depicted in FIG. 1. The clamp comprises a coil of insulated conducting wire 56 wound on a ferromagnetic core 58. A source of dc current 59 is connected to the coil 56 through a normally open switch 60. The electromagnet is energized when the switch 60 is closed. Current flowing through the electromagnet coil 56 sets up a magnetic field which clamps the probe positioning stage 46 to the wafer positioning stage top plate 6. Top plate 6 must be at least partially formed of a ferromagnetic material for this purpose. The X' and Y' bearings allow the test probe 42 to be moved as a unit with the wafer 2 when the probe positioning stage 46 and wafer positioning stage 12 are clamped together. When the electromagnet coil 56 is not energized, the wafer positioning stage 12 can be moved independently of the electrical test probe 42.

Although the electromagnetic clamp is shown and has been described as part of the probe positioning stage 46, it could also have been located on plate 6. In this event, the electromagnet when energized would attract and clamp to probe positioning stage 46. Thus there is a degree of design flexibility with respect to the placement of the electromagnetic clamp.

The Z adjustment rod 54 passes through the top of the vacuum chamber 8 through an "O"-ring seal 61 and is connected through a coupling 62 to the threaded shaft 64 of a Z drive motor 66. The X drive coupling 24, the Y drive coupling (not shown), and Z drive coupling 62 can all be implemented as short cylindrical rods drilled at either end to accept the ends of the respective threaded and smooth shafts. The shafts can be held by set screws in threaded holes drilled transversely to the the shafts. The X, Y, and Z drive motors can all be Airpax series 92400 linear actuators, attached respectively to the vacuum chamber 8 by means of an X mounting bracket 68, a Y mounting bracket (not shown), and a Z mounting bracket 70.

The test probe 42 includes a commercially available, removable test probe card having a plurality of contact fingers 44, typically tungsten wires, which have been etched down to a diameter of a few microns at their tips to accommodate the size of the contact pads on the VLSI chip on wafer 2. The number and location pattern of contact fingers on a particular card match the number and location pattern of the contact pads on a particular type of IC chip; there may be as many as several hundred contact fingers, although only nine are shown in FIGS. 2 and 3 for simplicity. The ends of the contact fingers lie substantially in a plane, and small deviations of the ends from planarity are accommodated by the springiness of the tungsten wire. The contact fingers 44 are connected electrically to wires (not shown) leading out of the vacuum chamber 8 via a vacuum feedthrough to a power supply for the chip circuit and appropriate electrical testing apparatus (not shown).

As shown in FIG. 1, the electrical contact fingers 44 which form part of the test probe 42 are touching the wafer 2 so that power and test signals can be supplied to a chip on the wafer 2. While the chip is being tested it is simultaneously observed with the voltage-contrast detector 72, which detects secondary electrons emitted from the chip as a result of the impinging electrons in the electron microscope beam 10.

It is anticipated that the electrical test probe 42 would be adjusted external to the vacuum system so that its angular orientation and the height of its mechanical contacts 44 are proper when the test probe 42 is lowered onto the wafer 2 whose chips are to be tested. This also requires that the height of the test wafer 2 and its orientation be controlled when it is mounted on the wafer mounting block 4 on the X-Y stage top plate 6. In an alternate embodiment of the present invention, height and angular orientation adjustments for the electrical test probe 42 are provided as part of the section of the probe positioning stage at the location marked "A" in FIG. 1. FIGS. 2 and 3 show such an arrangement for adjusting the vertical position and angular orientation of test probe 42.

In FIGS. 2 and 3 a vertical adjustment flexure 74 comprises two parallel flexible plates 76a, 76b which are secured on one side by a fixed clamping piece 78, and on the opposite side by a vertically movable clamping piece 80 of the probe positioning stage 46. Adjustment of the test probe's vertical position is made by turning a first screw 82 in a tapped hole through fixed clamping piece 78 to bear against the top of movable clamping piece 80, against the opposing force of a first coil spring 84 which resides in a recess of movable clamping piece 80. Spring 84 bottoms against a fixed arm 86 which extends from clamping piece 78.

A rotational adjustment in a horizontal plane is provided for the test probe 42 by vertical flexible plates 90a, 90b. These plates are secured on one side by vertically movable clamping piece 80, and on their opposite sides by a ring 92 which encircles and is attached to the test probe 42. Clamping piece 80 has a vertical slot 94, on one side of which a screw 96 resides in a tapped hole in the clamping piece 80 and extends into the slot 94, and on the other side of which a coil spring 98 is set in a recess adjacent to the slot 94. Adjustment of the angular position of the test probe 42 is made by turning screw 96 to bear against an arm 100 which extends from ring 92. Coil spring 98 opposes the adjustment. The screw movement causes the arm 100 to rotate the ring 92 and the attached test probe 42.

The sequence of events in testing an IC chip is as follows, referring again to FIGS. 1, 2, 3 and 4. The wafer 2 on which the chip circuits lie is mounted on the wafer mounting block 4 of plate 6 inside the vacuum chamber 8. A card of contact fingers 44 which match the IC chip to be tested is installed in the test probe 42 and positioned roughly above the wafer 2 but not in contact with the wafer. Wafer 2 is then aligned relative to the electrical probe 42 with the drive arrangements as described above, to move the wafer 2 around in a horizontal plane on the sets of mutually perpendicular translation bearings 14 and 18. Fine adjustments of the vertical position and angular orientation of the test probe 42 relative to the wafer 2 can alternately be made with the vertical and angular flexure arrangements described above.

Once the alignment is satisfactory the test probe contact fingers 44 are lowered until they touch the wafer 2. At this time current is allowed to flow through the coil 56 of the electromagnet to clamp the probe positioning stage 46 to the wafer positioning stage 12. Movements of the wafer 2 after clamping has taken place are accommodated by the sets of X' and Y' translation bearings. The position of the chip with the attached test probe contact fingers 44 in the field of view of the voltage-contrast scanning electron microscope can be controlled by the X drive motor 20 and Y drive motor 34. Different areas of a particular chip can be examined, and all the chips on the wafer can be examined in turn.

Although the alignment of the wafer with the test probe has been described in terms of moving the wafer around with the X-Y stage drives, it would also be possible to provide drives for the X'-Y' stage. In that case alignment of the wafer and the probe could be effected by moving the probe in drive mechanisms provided.

The present invention has been described in detail with reference to particular preferred embodiments, but persons with ordinary skill in the art pertaining to this invention will appreciate that various modifications may be made without departing from the invention's spirit and scope.

What is claimed is:

1. Apparatus for coordinating the movement of a semiconductor wafer with an electrical tests probe for testing integrated circuit chips on the wafer while the circuits are powered, comprising:
   means for aligning and bringing into contact said test probe with a chip on a wafer;
   a clamp for clamping said test probe with a wafer; and
   means for moving said test probe and a wafer as a unit while said test probe and a wafer are clamped together, the means for moving itself comprising an aspect of the testing of a chip.

2. Apparatus for coordinating the movement of a semiconductor wafer with an electrical test probe for testing integrated circuit chips on the wafer while the circuits are powered, comprising:
   means for supporting said test probe;
   means for supporting a wafer;
   means for aligning and bringing into contact said test probe with a chip on a wafer;
   a clamp for clamping said test probe with a wafer; and
   means for moving said test probe and a wafer as a unit while said test probe and a wafer are clamped together, the means for moving itself comprising an aspect of the testing of a chip.

3. Apparatus for coordinating the movement of a semiconductor wafer with an electrical test probe for testing integrated circuit chips on the wafer while the circuits are powered, comprising:
   an electrical test probe;
   means for moving the test probe;
   means for moving a semiconductor wafer, the means for moving itself comprising an aspect of the testing of a chip; and
   clamping means for clamping said probe moving means and said wafer moving means so that a wafer and test probe can be moved as a unit during active testing, and for disconnecting the probe moving means and the wafer moving means so that a wafer and test probe can be moved independently when a wafer is not being tested.

4. The apparatus of claim 3, in which:
   said wafer moving means is a first positioning stage adapted to move in a first plane, which comprises:
   X drive means, for controlling the movement of said first positioning stage in a first direction in said first plane;
   Y drive means, for controlling the movement of said first positioning stage in a second direction in said first plane; and
   said probe moving means is a second positioning stage adapted to move in a second plane parallel to said first plane, and also vertically, which comprises:
   Z drive means, for controlling the vertical movement of said second positioning stage.

5. The apparatus of claim 4, in which said clamping means is an electromagnet formed on one of said positioning stages, which clamps said probe positioning stage to said wafer positioning stage in response to an electric current through said electromagnet.

6. The apparatus of claim 4, in which said probe moving means further comprises:
vertical adjustment means for adjusting the vertical position of said test probe; and
angular adjustment means for adjusting the angular orientation of said test probe with respect to rotation about a vertical axis.

7. Apparatus for coordinating the movement of a semiconductor wafer with an electrical test probe for testing integrated circuit chips on the wafer while the circuits are powered, comprising:
a wafer positioning stage having a top plate adapted to move in a first plane;
wafer mounting means on said wafer positioning stage for mounting a wafer;
X drive means for controlling the movement of said wafer positioning stage in one direction in said first plane, drivingly connected to said wafer positioning stage;
Y drive means for controlling the movement of said wafer positioning stage in a second direction in said first plane, drivingly connected to said wafer positioning stage;
the X and Y drive means themselves comprising an aspect of the testing of a chip;
a probe positioning stage adapted to move in a second plane parallel to said first plane;
a probe with a plurality of electrical contact fingers mounted on said probe positioning stage;
Z drive means for controlling the vertical movement of said probe positioning stage, drivingly connected to said probe positioning stage; and
clamping means for clamping said probe and wafer positioning stages so that a wafer and test probe can be moved as a unit during active testing, and for disconnecting the test probe and the wafer positioning stages so that a wafer and test probe can be moved independently when a wafer is not being tested.

8. The apparatus of claim 7, further comprising an outer chamber, and in which:
said wafer positioning stage comprises:
a pair of spaced Y translation linear bearings aligned along a first direction in said first plane, mounted on the bottom of said chamber;
an intermediate plate attached to and riding on said Y translation bearings;
a pair of spaced X translation linear bearings mounted on said intermediate plate, and aligned along a second direction in said first plane;
a top plate attached to and riding on said X translation bearings;
said Y drive means comprises:
a Y drive motor mounted on the outside of said chamber;
a Y drive shaft which is coupled at one end to said Y drive motor, for linear movement thereby, and at the other end to said intermediate plate, said Y drive shaft entering said chamber through a vacuum seal;
said X drive means comprises:
an X drive motor mounted on the outside of said chamber;
an X drive shaft which is coupled at one end to said X drive motor for linear movement thereby, said X drive shaft entering said chamber through a vacuum seal;
a bearing block which holds the other end of said X drive shaft;
a rod on which said bearing block rides; and
brackets fixed to said top plate which hold the ends of said rod;
so that said top plate can move relative to said X drive shaft as said bearing block rides on said rod.

9. The apparatus of claim 8, in which said clamping means is an electromagnet formed on one of said positioning stages, which clamps said probe positioning stage to said wafer positioning stage in response to an electric current through said electromagnet.

10. The apparatus of claim 7, in which said probe positioning stage comprises:
a probe mount for mounting said probe;
a pair of spaced Y' translation linear bearings mounted on said probe mount and aligned along a first direction in said second plane;
a middle plate attached to and riding on said Y' translation bearings;
a pair of spaced X' translation linear bearings mounted on said middle plate and aligned along a second direction in said second plane;
a vertical plate attached to the inside top of said chamber;
a pair of spaced Z translaton linear bearings mounted on one side of said vertical plate and aligned in a vertical direction;
an "L"-shaped plate, one arm of which is attached to and rides on said Z translation bearings, and the other arm of which is attached to and rides on said X' translation bearings;
a Z drive motor mounted on the outside of said chamber; and
a vertical adjustment rod, which is coupled at one end to said Z drive motor, for linear movement thereby, and at the other end to said "L"-shaped plate, said vertical adjustment rod entering said chamber through a vacuum seal.

11. The apparatus of claim 10, in which said clamping means is an electromagnet formed on one of said positioning stages, which clamps said probe positioning stage to said wafer positioning stage in response to an electric current through said electromagnet.

12. The apparatus of claim 7, further comprising:
vertical adjustment means forming part of said probe positioning stage, for adjusting the vertical position of said test probe; and
angular adjustment means connecting said vertical adjustment means and said test probe, for adjusting the angular orientation of said test probe with respect to rotation about a vertical axis.

13. Apparatus as claimed in claim 12, in which said vertical adjustment means comprises:
two parallel flexible plates;
a fixed clamping piece which secures said flexible plates on one side;
a vertically movable clamping piece which secures said flexible plates on their other side;
a fixed arm which extends from said fixed clamping piece toward said movable clamping piece between said flexible plates;
a screw which resides in a tapped hole through said fixed clamping piece and extends beyond said hole to touch the top of said movable clamping piece; and a spring which resides in a recess underneath the top part of said movable clamping piece and which bottoms against said fixed arm;

whereby adjustment of the vertical position of the test probe is made by turning the screw in the tapped hole through the fixed clamping piece to bear against the top of movable clamping piece, against the opposing force of the coiled spring in the recess of the movable clamping piece.

14. Apparatus as claimed in claim 13, in which said angular adjustment means comprises:

two vertical flexible plates;

a vertically movable clamping piece which secures said vertical flexible plates on one side, said clamping piece having a vertical slot and a tapped hole in one side of said vertical slot;

a ring which secures said vertical flexible plates on their other side, and which encircles and is attached to said test probe;

a screw which resides in said tapped hole in said clamping piece and extends into said slot;

a coil spring set in a recess adjacent to said slot on the side opposite said tapped hole; and an arm connecting said ring and said vertically movable clamping piece adjacent said slot;

whereby adjustment of the angular orientation of the test probe is made by turning the screw to bear against the arm extending from the ring, against the opposing force of the coil spring, which causes the arm to rotate the ring and the attached test probe.

15. The apparatus of claim 14, in which said clamping means is an electromagnet formed on one of said positioning stages, which clamps said probe positioning stage to said wafer positioning stage in response to an electric current through said electromagnet.

* * * * *